(12) United States Patent
Hashimoto et al.

(10) Patent No.: US 6,603,147 B1
(45) Date of Patent: Aug. 5, 2003

(54) SEMICONDUCTOR LIGHT EMITTING DEVICE

(75) Inventors: Shigeki Hashimoto, Kanagawa (JP); Katsunori Yanashima, Kanagawa (JP); Masao Ikeda, Kanagawa (JP); Hiroshi Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 58 days.

(21) Appl. No.: 09/587,254

(22) Filed: Jun. 2, 2000

(30) Foreign Application Priority Data

Jun. 4, 1999 (JP) .......................... 11-157616

(51) Int. Cl.[7] .......................... H01L 29/221
(52) U.S. Cl. .......................... 257/96; 257/103
(58) Field of Search .......................... 257/103, 94, 96; 372/44, 45

(56) References Cited

U.S. PATENT DOCUMENTS 5,670,798 A    9/1997  Schetzina
6,307,219 B1 * 10/2001 Oku et al. .................. 257/101

FOREIGN PATENT DOCUMENTS

| EP | 0 716 457 A2 | 6/1996 |
| EP | 0 772 249 A2 | 5/1997 |
| EP | 0 890 997 A2 | 1/1999 |

OTHER PUBLICATIONS

Shuji Nakamura, "GaN–Based Blue/Green Semiconductor Laser", Apr. 1997, IEEE Journal of Selected Topics in Quantum Electronics, vol. 3 No. 2., pp. 435–442.

* cited by examiner

*Primary Examiner*—Sara Crane
(74) *Attorney, Agent, or Firm*—Rader, Fishman & Grauer PLLC; Ronald P. Kananen, Esq.

(57) ABSTRACT

A semiconductor light emitting device using nitride III-V compound semiconductors is improved to reduce the threshold current density with almost no increase of the operation voltage. In a GaN semiconductor laser as one version thereof, the p-type cladding layer is made of two or more semiconductor layers different in band gap, and a part of the p-type cladding layer near one of its boundaries nearer to the active layer is made of a semiconductor layer having a large band gap than that of the remainder part. More specifically, in a AlGaN/GaN/GaInN SCH-structured GaN semiconductor laser, a p-type AlGaN cladding layer is made of a p-type $Al_{x1}Ga_{1-x1}N$ layer in contact with a p-type GaN optical guide layer, and a p-type $Al_{x2}Ga_{1-x2}N$ layer overlying the p-type $Al_{x1}Ga_{1-x1}N$ layer (where $0 \leq x2 < x1 \leq 1$).

5 Claims, 6 Drawing Sheets

Fig. 1

Al COMPOSITION OF p-TYPE AlGaN CLADDING LAYER (%)

| THICKNESS OF p-TYPE $Al_{x1}Ga_{1-x1}N$ LAYER 10a (x1=0.08) | 30nm | 50nm | 80nm |
|---|---|---|---|
| | SMALL | ⟵⟶ | LARGE |
| THRESHOLD CURRENT | LARGE | ⟵⟶ | SMALL |
| OPERATION VOLTAGE | SMALL | ⟵⟶ | LARGE |

SEMICONDUCTOR LIGHT EMITTING DEVICE

BACKGROUND OF THE INVENTION

1. Field of the Invention

This invention relates to a semiconductor light emitting device, and more particularly to a light emitting device using nitride III-V compound semiconductors.

2. Description of the Related Art

Nitride III-V compound semiconductors represented by gallium nitride (GaN) (hereinafter called GaN semiconductors) has lately attracted much attention, with development of light emitting diodes (LED) using GaN semiconductors into practical use and realization of laser diodes using GaN semiconductors, and applications thereof as light sources of optical disc devices and others are expected.

GaN semiconductor lasers basically have a DH structure (double heterostructure) which sandwiches an active layer of GaInN between an n-type AlGaN cladding layer and a p-type AlGaN cladding layer. The n-type AlGaN cladding layer and the p-type AlGaN cladding layer have lower refractive indices and higher band gaps than the active layer, and function to confine light generated in the active layer and prevent overflow of carriers. GaN semiconductor lasers having a SCH structure (Separate Confinement Heterostructure) additionally include an n-type GaN optical guide layer between the active layer and the n-type AlGaN cladding layer, and a p-type GaN optical guide layer between the active layer and the p-type AlGaN cladding layer. Most of the GaN semiconductor lasers having heretofore attained continuous oscillation at room temperatures have this AlGaN/GaN/GaInN SCH structure. Among them, those having emission wavelengths in the band of 400 nm are so configured that the active layer is made of GaInN with the In composition of about 15%, and the n-type AlGaN cladding layer and the p-type AlGaN cladding layer are made of AlGaN with the Al composition of about 6 through 8%.

In these conventional GaN semiconductor lasers, operation currents and operation voltages are higher than those of AlGaAs semiconductor lasers and AlGaInP semiconductor lasers already brought into practice, and these are an issue for their practical use.

For reducing the operation current of a GaN semiconductor laser, it is effective to reduce the threshold current density. For realization thereof, there is a technique of decreasing the refractive index and increasing the band gap of the n-type AlGaN cladding layer and the p-type AlGaN cladding layer by increasing the Al composition thereof, to increase the optical confinement ratio Γ and prevent overflow of carriers. The p-type AlGaN cladding layer, however, exhibits the tendency that generation of carriers therein becomes difficult as the band gap increases. Therefore, if the Al composition of the p-type AlGaN cladding layer is increased to lower the threshold current density, it invites the problem that the resistance in the p-type AlGaN cladding layer increases and the operation voltage of the device increases.

Figure 1:
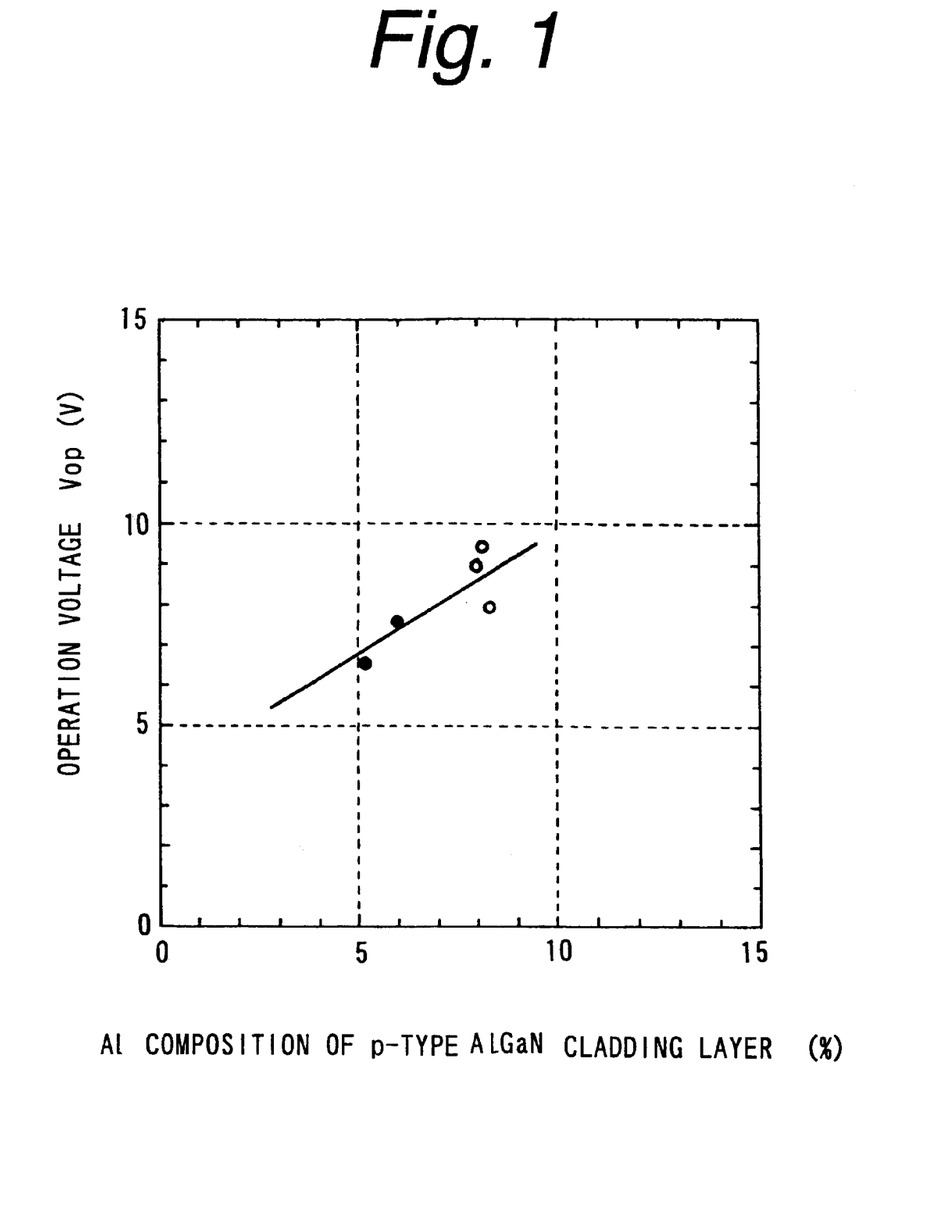
FIG. 1 is a graph showing a relation between the Al composition of a p-type AlGaN cladding layer and the operation voltage in a conventional GaN semiconductor laser.

FIG. 1 is a graph showing a relation between the Al composition of the p-type AlGaN cladding layer and the operation voltage in a conventional GaN semiconductor laser. Samples used for this measurement are of a ridge stripe type having the AlGaN/GaN/GaInN SCH structure, having the cavity length of 1 mm and the stripe width of 3.5 μm. The operation voltage $V_{op}$ in FIG. 1 is the value which was obtained by driving the samples with pulses at the room temperature under the conditions: frequency of 1 kHz, duty ratio of 0.5% and electric current of 100 mA. It is known from FIG. 1 that the operation voltage $V_{op}$ rises as the Al composition of the p-type AlGaN cladding layer increases. Such rise of the operation voltage not only shorten the lifetime of the device but also prevents improvements of semiconductor lasers toward higher output powers. Therefore, there is a demand for development of GaN semiconductor lasers capable of oscillation with a low threshold current density while minimizing such increase of the operation voltage.

OBJECTS AND SUMMARY OF THE INVENTION

It is therefore an object of the invention to provide a semiconductor light emitting device using nitride III-V compound semiconductors capable of lowering the threshold current density with no substantial increase of the operation voltage.

According to the invention, there is provided a semiconductor light emitting device having a structure in which an active layer is sandwiched between an n-type cladding layer and a p-type cladding layer, the active layer, the n-type cladding layer and the p-type cladding layer being made of nitride III-V compound semiconductor, comprising:

at least a p-type AlGaN layer, an optical guide layer and a third p-type semiconductor layer, said third p-type semiconductor layer being a p-type cladding layer comprising at least a first and a second p-type semiconductor coating layer whereby the first p-type semiconductor coating layer nearer to said active layer being made of a semiconductor layer material having a larger band gap than that of the second p-type semiconductor coating layer, and the optical guide layer and the second p-type semiconductor coating layer being different in band gap from each other; wherein the optical guide layer has a smaller band gap than the first p-type semiconductor coating layer.

In the present invention, the nitride III-V compound semiconductors are composed of at least one kind of group III element selected from the group consisting of Ga, Al, In, B and Tl, and one or more group V elements which include at least N and may additionally include As or P.

In the present invention, the p-type cladding layer is made up of two or more semiconductor layers made of $B_xAl_yGa_zIn_{1-x-y-z}N$ (where $0 \leq x \leq 1$, $0 \leq y \leq 1$, $0 \leq z \leq 1$ and $0 \leq x+y+z \leq 1$) and different in composition.

In the present invention, for the purpose of effectively preventing overflow of electrons into the p-type cladding layer, one of the semiconductor layers, which forms the portion near the boundary of the p-type cladding layer nearer to the active layer and has a larger band gap, is preferably located in a position within the distance of 100 nm from the boundary of the p-type cladding layer nearer to the active layer, and more preferably in a position within the distance of 50 nm from the boundary of the p-type cladding layer nearer to the active layer. Thickness of the semiconductor layer having the large band gap is preferably selected from the range from 20 nm to 100 nm in order to minimize the increase of the resistance by this layer.

In the present invention, the p-type cladding layer is typically composed of a first semiconductor layer nearer to the active layer and a second semiconductor layer on the first semiconductor layer because it is simple in structure but highly effective in preventing overflow of electrons, and the band gap of the first semiconductor layer is made larger than the band gap of the second semiconductor layer. In this case, the band gap of the first semiconductor layer is determined so that a barrier high enough to prevent overflow of electrons be made in the conduction band of the p-type cladding layer, for the purpose of ensure the function of this layer as a barrier layer. On the other hand, the band gap or the second semiconductor layer having a smaller band gap is determined to make the resistance as low as possible for the purpose of restricting the increase of the operation voltage while maintaining a certain value of refractive index which does not unacceptably deteriorate optical confinement in the vertical direction.

According to the semiconductor light emitting device having the above-summarized construction according to the invention, since the p-type cladding layer includes two semiconductor layers different in band gap from each other, and the part of the p-type cladding layer near the boundary with the active layer is made up of the semiconductor layer having a larger band gap than that of the other portion, and overflow of carriers (electrons), from the side of the n-type cladding layer to the side of the p-type cladding layer is therefore prevented. Therefore, increase of the resistance in the p-type cladding layer is minimized. As a result, it is possible to lower the threshold current density with no substantial increase of the operation voltage in the semiconductor light emitting device using nitride III-V compound semiconductors.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings. In all figures showing embodiments, identical or equivalent elements are labeled with common reference numerals.

Figure 2:
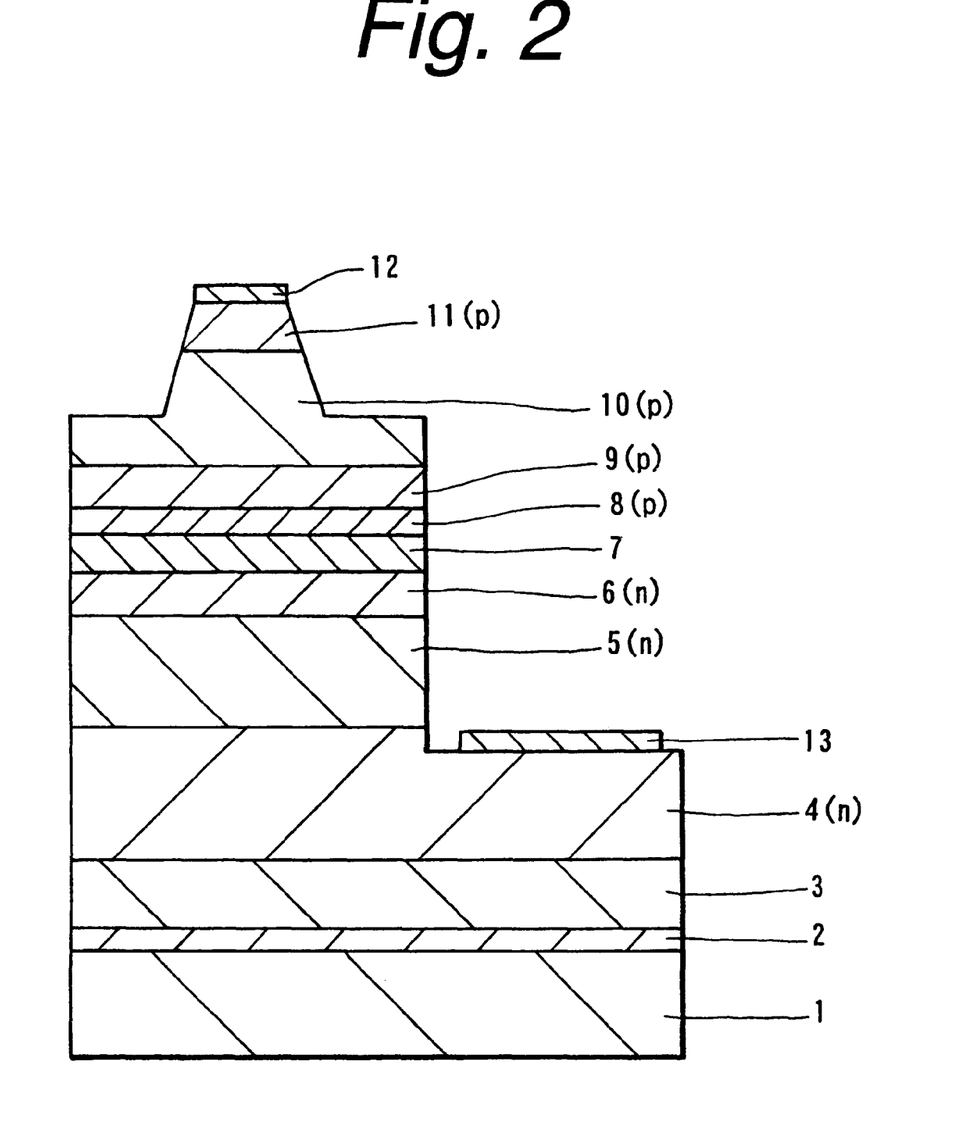
FIG. 2 is a cross-sectional view of a GaN semiconductor laser according to the first embodiment of the invention.

FIG. 2 is a cross-sectional view of a GaN semiconductor laser according to the first embodiment of the invention. This GaN semiconductor laser is of a ridge-stripe type having an AlGaN/GaN/GaInN SCH structure. Its active layer has a multi-quantum well (MQW) structure.

As shown in FIG. 2, in the GaN semiconductor laser according to the first embodiment, sequentially stacked on a c-plane sapphire substrate 1, for example, via an undoped GaN buffer layer 2 by low-temperature growth: an undoped GaN layer 3, n-type GaN contact layer 4, n-type AlGaN cladding layer 5, n-type GaN optical guide layer 6, active layer 7 of a MQW structure having undoped GaInN quantum well layers, p-type AlGaN cap layer 8, p-type GaN optical guide layer 9, p-type AlGaN cladding layer 10 of a multi-layered structure explained later, and p-type GaN contact layer 11.

The GaN buffer layer 2 is 200 nm thick, for example. The GaN layer 3 is 1 $\mu$m thick, for example. The n-type GaN contact layer 4 is 2 $\mu$m thick, for example, and doped with silicon (Si), for example, as the n-type impurity. The n-type AlGaN cladding layer 5 is made of n-type $Al_{0.06}Ga_{0.94}N$, for example. The n-type AlGaN cladding layer 5,is 1 $\mu$m thick, for example, and doped with Si, for example, as the n-type impurity. The n-type GaN optical guide layer 6 is 100 nm thick, for example, and doped with Si, for example, as the n-type impurity. The GaInN quantum well layers of the active layer 7 are made of $Ga_{0.85}In_{0.15}N$, for example. In this case, emission wavelength of the semiconductor laser is about 400 nm. Each GaInN quantum well layer of the active layer is 3.5 nm thick, for example.

The p-type AlGaN cap layer 8 is made of p-type $Al_{0.2}Ga_{0.8}N$, for example. This p-type AlGaN cap layer 8 is 10 nm thick, for example, and doped with magnesium (Mg), for example, as the p-type impurity. The p-type AlGaN cladding layer 10 is made up of two p-type $Al_{x1}Ga_{1-x1}N$ layer and p-type $Al_{x2}Ga_{1-x2}N$ layer ($0 \leq x2 < x1 \leq 1$). The p type AlGaN cladding layer 10 as a whole is 1 $\mu$m thick, for example, and doped with Mg, for example, as the p-type impurity. A concrete structure of the p-type AlGaN cladding layer 10 will be explained later in greater detail. The p-type GaN contact layer 11 is 100 nm thick, for example, and doped with Mg, for example, as the p-type impurity.

The upper part of the p-type AlGaN cladding layer 10 and the p-type GaN contact layer 11 have a shape of a predetermined ridge stripe extending in one direction. The n-type GaN optical guide layer 6, active layer 7, p-type AlGaN cap layer 8, p-type GaN optical guide layer 9 and lower part of the p-type AlGaN cladding layer 10 have a predetermined mesa configuration. In the ridge stripe portion, a p-side electrode 12 such as Ni/Pt/Au electrode or Ni/Au electrode is provided on the p-type GaN contact layer 11. On a location of the n-type GaN contact layer 4 adjacent to the mesa portion, an n-side electrode 13 such as Ti/Al/Pt/Au electrode is provided. This GaN semiconductor laser has a cavity length of 1 mm, for example, and the width of the ridge stripe portion (stripe width) is 3.5 $\mu$m, for example.

Figure 3:
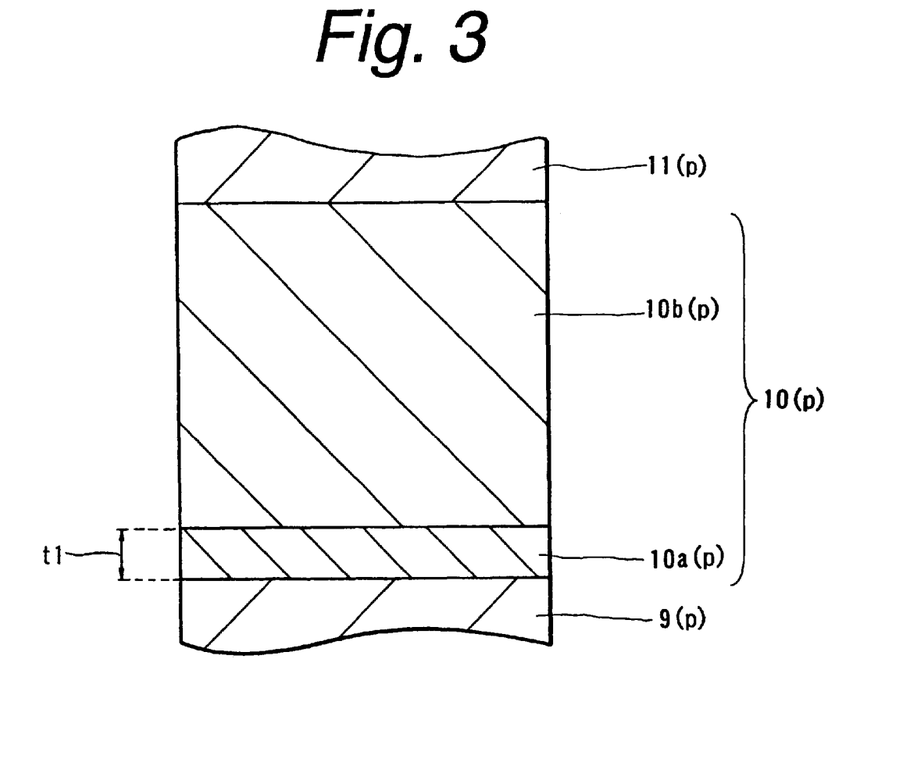
FIG. 3 is a cross-sectional view showing a detail configuration of a p-type AlGaN cladding layer in the GaN semiconductor laser according to the first embodiment of the invention.
Figure 4:
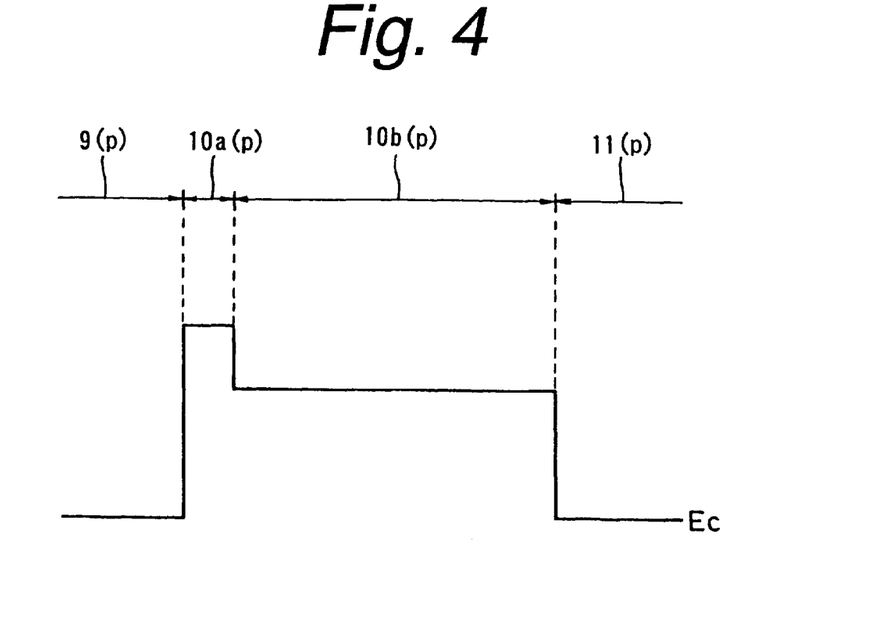
FIG. 4 is an energy band diagram of the GaN semiconductor laser according to the first embodiment of the invention.

The GaN semiconductor laser according to the first embodiment is characterized in the p-type AlGaN cladding layer 10 which is composed of the p-type $Al_{x1}Ga_{1-x1}N$ layer and the p-type $Al_{x2}Ga_{1-x2}N$ which are different in band gap from each other. More specifically, this p-type AlGaN cladding layer 10 is configured as explained below. FIG. 3 shows a detail configuration of the p-type AlGaN cladding layer 10 in the GaN semiconductor laser according to the invention. FIG. 4 is an energy band diagram of the GaN semiconductor laser according to the first embodiment, which particularly shows its conduction band. In FIG. 4, $E_c$ is the bottom energy of the conduction band.

As shown in FIGS. 3 and 4, in the GaN semiconductor laser according to the first embodiment, the p-type AlGaN cladding layer 10 is made of the p-type $Al_{x1}Ga_{1-x1}N$ layer 10a in contact with the p-type GaN optical guide layer 9, and the p-type $Al_{x2}G_{1-x2}N$ layer 10b overlying the $Al_{x1}Ga_{1-x1}N$ layer 10a. The p-type $Al_{x1}Ga_{1-x1}N$ layer 10a has a larger Al composition than the p-type $Al_{x2}Ga_{1-x2}N$ layer 10b, and therefore has a higher band gap.

Of these p-type $Al_{x1}Ga_{1-x1}N$ layer 10a and p-type $Al_{x2}Ga_{1-x2}N$ layer 10b, the p-type $Al_{x1}Ga_{1-x1}N$ layer 10a having a larger band gap has the role of a barrier layer for preventing that electrons moving from the part of n-type semiconductor layers are not injected into the active layer 7 and overflow into the part of p-type semiconductor layers. On the other hand, the p-type $Al_{x2}Ga_{1-x2}N$ layer 10b forms most part of the p-type AlGaN cladding layer 10, and most of influences of the p-type AlGaN cladding layer 10 to the resistance and and vertical optical guidance derive from this p-type $Al_{x2}Ga_{1-x2}N$ layer 10b. Compositions and thicknesses of these p-type $Al_{x1}Ga_{1-x1}N$ layer 10a and p-type $Al_{x2}Ga_{1-x2}N$ layer 10b forming the p-type AlGaN cladding layer 10 are determined so that they can fulfill their roles, respectively.

As to the composition of the p-type $Al_{x2}Ga_{1-x2}N$ layer 10b, it is chosen to maintain an appropriate degree of refractive index not causing significant deterioration of optical confinement in the vertical direction and decrease the resistance as low as possible. More specifically, in case of a Mg-doped p-type $Al_{x2}Ga_{1-x2}N$ layer 10b, the Al composition x2 is preferably selected from the range $0.05 \leq x2 \leq 0.08$, for example. After selecting the composition of the p-type $Al_{x2}Ga_{1-x2}N$ layer 10b, the Al composition x1 of the p-type $Al_{x1}Ga_{1-x1}N$ layer 10a is preferably determined to be larger than the Al composition x2 of the p-type $Al_{x2}Ga_{1-x2}N$ layer 10b by at least 0.02, for example, to have this layer function as a barrier layer, in other words, to ensure that a barrier high enough to prevent overflow of electrons be made in the conduction band of the p-type AlGaN cladding layer 10. Composition of the p-type $Al_{x1}Ga_{1-x1}N$ layer 10a is selected so that the band discontinuity between conduction bands of the p-type GaN optical guide layer 9 and the p-type $Al_{x1}Ga_{1-x1}N$ layer 10a be 100 meV or more. In an example of the Al composition x1 of the p-type $Al_{x1}Ga_{1-x1}N$ layer 10a and Al composition of x2 of the p-type $Al_{x2}Ga_{1-x2}N$ layer 10b in the first embodiment, x1=0.08 and x2=0.06, respectively.

Figure 5:
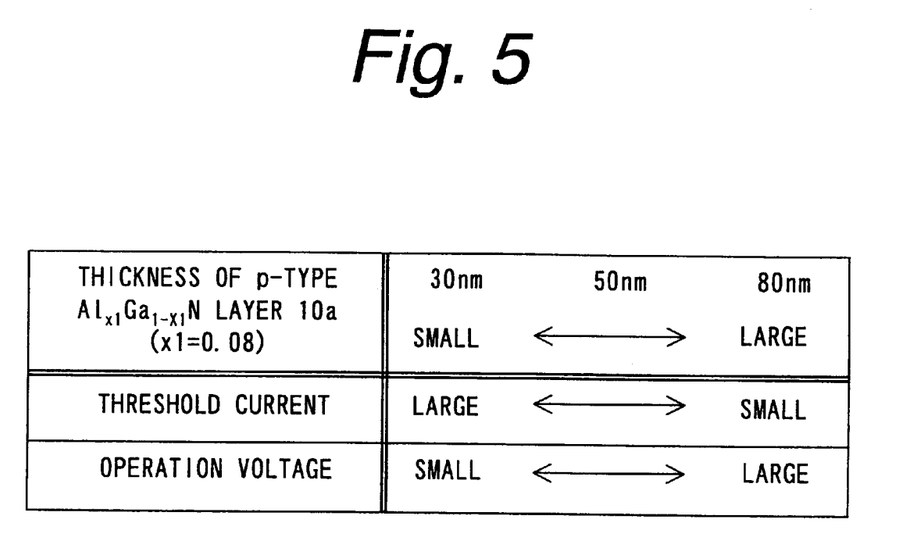
FIG. 5 is a schematic diagram for explaining changes in threshold current and operation voltage upon changes in thickness of the p-type $Al_{x1}Ga_{1-x1}N$ layer forming the p-type AlGaN cladding layer in the GaN semiconductor laser according to the first embodiment.

Thickness t1 of the p-type $Al_{x1}Ga_{1-x1}N$ layer 10a is required to be thick enough to prevent at least tunneling of electrons to ensure its function as the barrier layer, but it is also required to be as thin as possible to prevent the operation voltage from increasing due to the resistance of this layer. More specifically, the thickness t1 of the p-type $Al_{x1}Ga_{1-x1}N$ layer 10a is preferably optimized within the range from 20 nm to 100 nm, for example. The Inventor conducted an experiment to investigate modes of changes of the threshold current and operation voltage of the GaN semiconductor laser having the same structure as the one shown in FIG. 1 in which Al compositions x1 and x2 of the p-type $Al_{x1}Ga_{1-x1}N$ layer 10a and the p-type $Al_{x2}Ga_{1-x2}N$ layer 10b constituting the p-type AlGaN cladding layer 10 are x1=0.08 and x2=0.06, respectively, with changes in thickness t1 of the p-type $Al_{x1}Ga_{1-x1}N$ layer 10a from 30 nm, to 50 nm and 80 nm. FIG. 5 shows the results of the experiment.

It is known from FIG. 5 that the threshold current tends to decrease as the thickness t1 of the p-type $Al_{x1}Ga_{1-x1}N$ layer 10a increases, and the operation voltage tends to decrease as the thickness t1 of the p-type $Al_{x1}Ga_{1-x1}N$ layer 10a decreases. Therefore, when the Al composition of the p-type $Al_{x1}Ga_{1-x1}N$ layer 10a and the Al composition x2 of the p-type $Al_{x2}Ga_{1-x2}N$ layer 10b are x1=0.08 and x2=0.06, in order to ensure a predetermined threshold current reducing effect while preventing the increase of the operation voltage, the thickness t1 of the $Al_{x1}Ga_{1-x1}N$ is determined to be 50 nm, for example.

Through another experiment, it has been confirmed the larger the Al composition x1 of the p-type $Al_{x1}Ga_{1-x1}N$ layer 10a, the higher the effect of reducing the threshold current. Therefore, if x1=0.11 in the p-type $Al_{x1}Ga_{1-x1}N$ layer 10a, thickness t1 of the p-type $Al_{x1}Ga_{1-x1}N$ layer 10a required for obtaining an equivalent effect may be less than the case determining x1=0.08.

According to the GaN semiconductor laser having the above-explained configuration according to the first embodiment, since the p-type AlGaN cladding layer 10 is made of the p-type $Al_{x1}Ga_{1-x1}N$ layer 10a and the p-type $Al_{x2}Ga_{1-x2}N$ layer 10b (where $0 \leq x2 < x1 \leq 1$) different in band gap from each other, and the p-type $Al_{x1}Ga_{1-x1}N$ layer 10a located nearer to the active layer 7 and having a higher band gap functions as a barrier layer preventing overflow of electrons, the threshold current density is lowered than conventional ones. Furthermore, since the other part of the p-type AlGaN cladding layer 10 is formed by the p-type $Al_{x2}Ga_{1-x2}N$ layer 10b having a smaller band gap than the p-type $Al_{x1}Ga_{1-x1}N$ layer 10a, increase of the resistance of the p-type AlGaN cladding layer 10 as a whole can be prevented.

Next explained are results of an experiment concerning the effect of reducing the threshold current density by the use of the configuration of the p-type cladding layer according to the invention.

Figure 6:
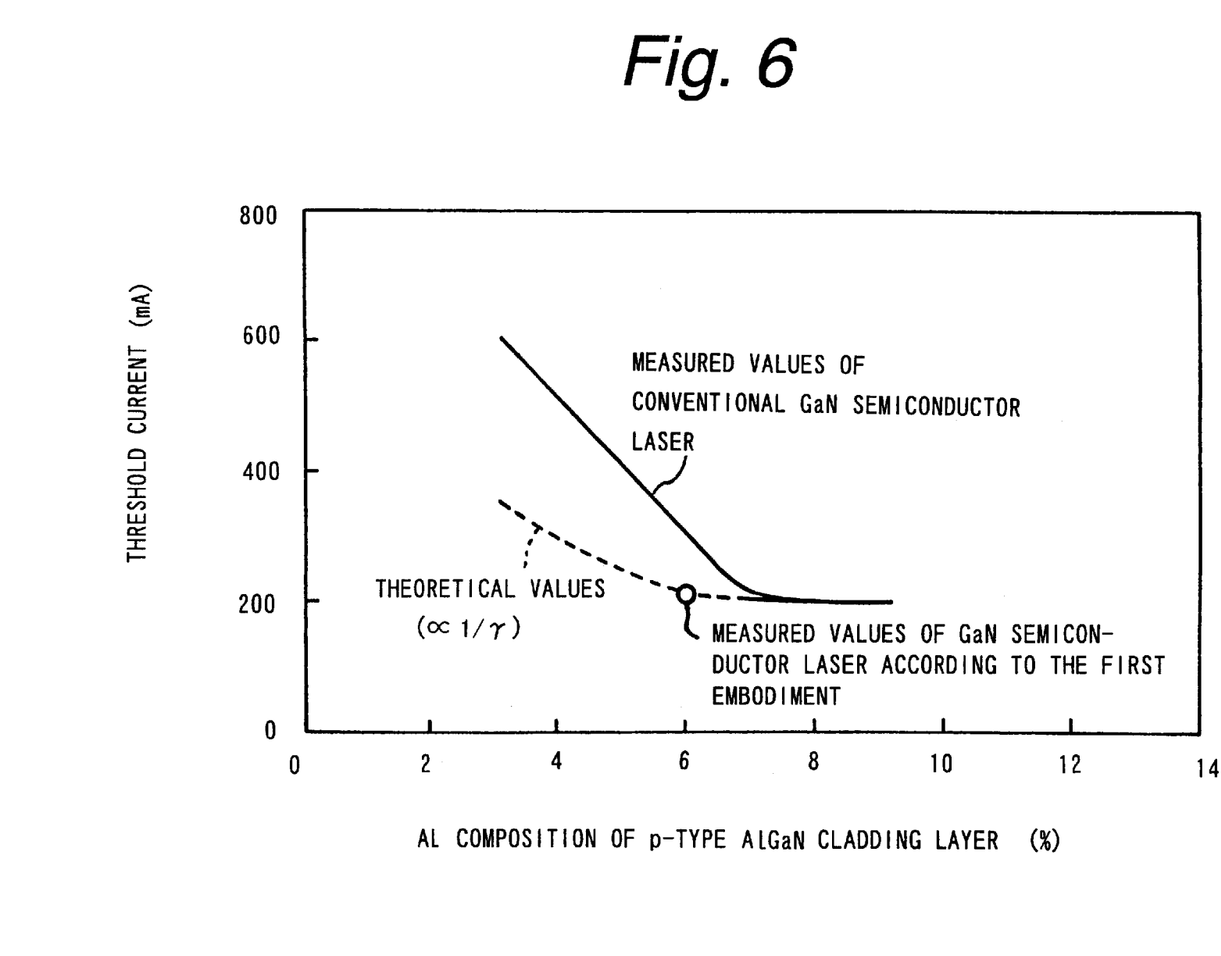
FIG. 6 is a graph showing a measured threshold current value of the GaN semiconductor laser according to the first embodiment of the invention, and a relation among the Al composition of a p-type AlGaN cladding layer in a conventional GaN semiconductor laser, its measured threshold current value and a theoretical value.

FIG. 6 shows a relation between the Al composition of the p-type AlGaN cladding layer and the threshold current in a conventional GaN semiconductor laser. In FIG. 6, the solid line graph is measured values of threshold current of the conventional GaN semiconductor laser. Samples used in this measurement had the same laser structure as the GaN semiconductor laser shown in FIG. 2 except that the band gap (composition) of the p-type AlGaN cladding layer was uniform, and they had the cavity length of 1 mm and the stripe width of 3.5 μm. The graph of the broken line indicates the theoretical values of the threshold current with no leak current. The theoretical values of the threshold current are proportional to the inverse number of the optical confinement ratio Γ. The circle (○) is the measured value of the threshold current of the GaN semiconductor laser according to the first embodiment (where the Al composition x1 of the p-type $Al_{x1}Ga_{1-x1}N$ layer 10a was 0.08, its thickness t1 was 50 nm, and the Al composition x2 of the p-type $Al_{x2}Ga_{1-x2}N$ layer 10b was 0.06).

As shown in FIG. 6, in the conventional GaN semiconductor laser using the p-type AlGaN cladding layer with a uniform band gap, the threshold current increases as the Al composition of the p-type AlGaN cladding layer becomes smaller, that is, the band gap becomes smaller. The region between the solid-line graph and the broken-line graph corresponds to leak current components of the injected current, which do not contribute to emission of light. In contrast, it is apparent that the measured value of the threshold current of the GaN semiconductor laser according to the first embodiment is close to the theoretical values of the threshold current of the conventional GaN semiconductor laser in which the Al composition of the p-type AlGaN cladding layer is 0.06. This evidences that the reason why the threshold current (threshold current density) decreases in the GaN semiconductor laser according to the first embodiment employing the configuration of the p-type cladding layer according to the invention as compared with the conventional GaN semiconductor laser lies in that the p-type $Al_{x1}Ga_{1-x1}N$ layer 10a formed as the barrier layer in the part of the p-type AlGaN cladding layer nearer to the active layer 7 reduces the leak current components.

As explained above, according to the GaN semiconductor laser by the first embodiment, it is possible to reduce the threshold current density without inviting substantial increase of the operation voltage. Additionally, the GaN semiconductor laser by the first embodiment is also advantageous in elongating the lifetime of the device and increasing the output power because it can prevent substantial increase of the operation voltage.

Figure 7:
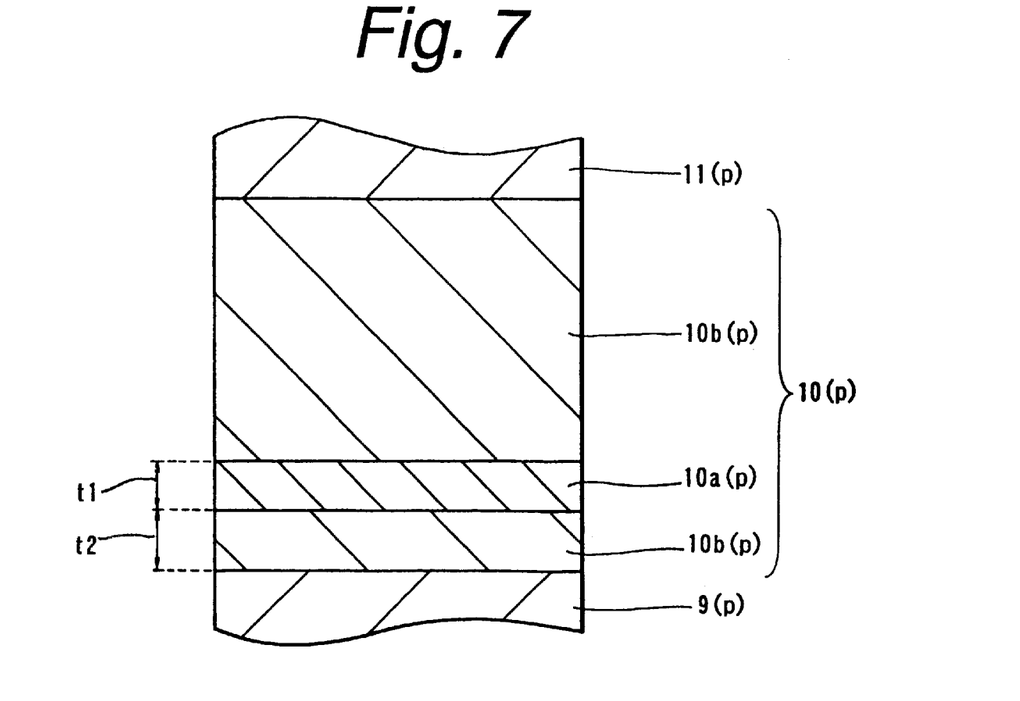
FIG. 7 is a cross-sectional view showing a detail configuration of a p-type AlGaN cladding layer in a GaN semiconductor laser according to the second embodiment of the invention.
Figure 8:
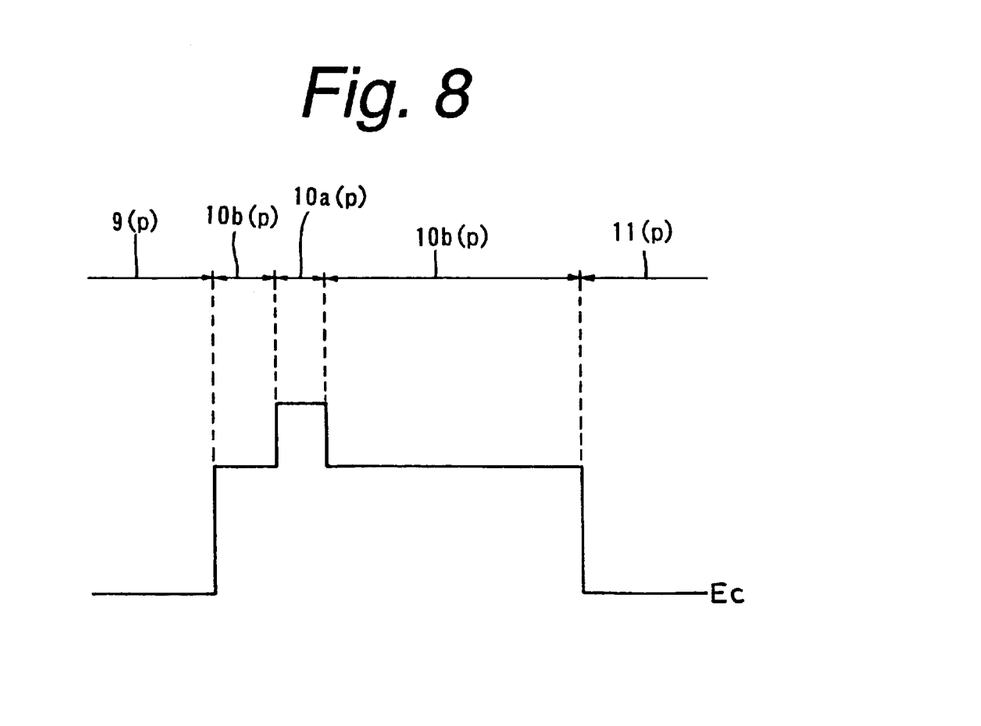
FIG. 8 is an energy band diagram of the GaN semiconductor laser according to the second embodiment of the invention.

Next explained is the second embodiment of the invention. FIG. 7 shows a detail configuration of the p-type AlGaN cladding layer 10 in a GaN semiconductor laser according to the second embodiment of the invention. FIG. 8 is an energy band diagram of the GaN semiconductor laser according to the second embodiment, which shows, in particular, its conduction band. In FIG. 8, $E_c$ is the bottom energy of the conduction band.

As shown in FIGS. 7 and 8, in the GaN semiconductor laser according to the second embodiment, the p-type AlGaN cladding layer 10 is made of a p-type $Al_{x2}Ga_{1-x2}N$ layer 10b in contact with the p-type GaN optical guide layer 9, a p-type $Al_{x1}Ga_{1-x1}N$ layer 10a thereon and another p-type $Al_{x2}Ga_{1-x2}N$ layer 10b thereon. In other words, they form a structure in which a barrier layer of p-type $Al_{x1}Ga_{1-x1}N$ is interposed in the p-type AlGaN cladding layer 10 made of p-type $Al_{x2}Ga_{1-x2}N$ in a portion near its boundary nearer to the active layer 7. In this case, the p-type $Al_{x1}Ga_{1-x1}N$ layer 10a as the barrier layer is preferably located within the distance of 100 nm from the boundary of the p-type AlGaN cladding layer 10 nearer to the active layer 7, and more preferably within the distance of 50 nm from the boundary of the p-type AlGaN cladding layer 10 nearer to the active layer 7. That is, thickness t2 of the $Al_{x2}Ga_{1-x2}N$ layer 10b between the p-type GaN optical guide layer 9 and the p-type $Al_{x1}Ga_{1-x1}N$ layer 10a is preferably 100 nm or less, and more preferably 50 nm or less.

In the other respects, configuration of the GaN semiconductor laser according to the second embodiment is the same as the GaN semiconductor laser according to the first embodiment, and their explanation is omitted.

The second embodiments also attains the same advantages as those of the first embodiment.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

For example, numerical values, structures, source materials and processes proposed in the above-explained embodiments are mere examples, and other appropriate numerical values, structures, source materials and processes may be used, if necessary. For example, the p-type AlGaN cladding layer 10 in the first and second embodiments may be made of three or more p-type $Al_xGa_{1-x}N$ layers (where $0 \leq x \leq 1$) having different band gaps. More specifically, the p-type AlGaN cladding layer 10 in the first embodiment, for example, may be made of a p-type $Al_{x1}Ga_{1-x1}N$ layer in contact with the p-type GaN optical guide layer 9, p-type $Al_{x2}Ga_{1-x2}N$ layer thereon and p-type $Al_{x3}Ga_{1-x3}N$ layer thereon (where $0 \leq x3 < x2 < x1 \leq 1$). In the case where the p-type AlGaN cladding layer 10 is made of such three p-type $Al_xGa_{1-x}N$ layers having different band gaps, these layers are typically stacked sequentially from one having the largest band gap. However, they may be stacked in a different way if it is ensured to lower the threshold current density without substantially increasing the operation voltage and it invites no adverse affection especially to confinement of light in the vertical direction. The p-type AlGaN cladding layer 10 in the second embodiment may be configured to have different band gaps (compositions) between the upper and lower sides of the p-type $Al_{x1}Ga_{1-x1}N$ layer 10a.

Also regarding compositions and thicknesses of respective semiconductor layers forming the laser structures shown in the first and second embodiments, appropriate compositions and thicknesses other than those shown above may be selected, if necessary. Particularly, the first and second embodiments have been explained as making the p-type cladding layer of p-type $Al_{x1}Ga_{1-x1}N$ as a typical example, but the p-type cladding layer may be made of $B_xAl_yGa_z In_{1-x-y-z}N$ (where $0 \leq x \leq 1$, $0 \leq y \leq 1$, $0 \leq z \leq 1$ and $0 \leq x+y+z \leq 1$).

Although the first and second embodiments were explained have been explained as applying the invention to ridge-stripe type GaN semiconductor lasers, the invention is similarly applicable also to GaN semiconductor lasers of an electrode stripe type.

Moreover, in the first and second embodiments, n-type semiconductor layers are stacked nearer to the substrate with respect to the active layer 7, and p-type semiconductor layers are stacked in the opposite side. However, it is also acceptable to locate p-type semiconductor layers nearer to the substrate with respect to the active layer 7 and locate n-type semiconductor layers in the opposite side.

Furthermore, explanation of the first and second embodiments was made as applying the invention to SCH-structured GaN semiconductor lasers, but the invention is applicable to, needless to say, DH-structured GaN semiconductors, and also to GaN light emitting diodes. The active layer may be configured as a single quantum well (SQW) structure.

As explained above, according to the semiconductor light emitting device in accordance with the invention, since the p-type cladding layer is made of two or more semiconductor layers different in band gap, and a part of the p-type cladding layer near the boundary thereof nearer to the active layer is made of a semiconductor layer having a larger band gap than the remainder part, overflow of carriers (electrons) from the side of the n-type cladding layer to the side of the p-type cladding layer is prevented, and part of the injected current which is lost as a leak current component is reduced. Therefore, the threshold current density can be lowered. In this case, since the remainder part of the p-type cladding layer may be made of a semiconductor layer having a smaller band gap than the semiconductor layer forming the portion near the boundary nearer to the active layer, substantial increase of the resistance in the p-type cladding layer can be prevented. As a result, it is possible to obtain a semiconductor light emitting device using nitride III-V compound semiconductors, which can lower the threshold current density with almost no increase of the operation voltage. Additionally, since such increase of the operation voltage is prevented, the lifetime of the device is elongated and improvement for higher output power can be realized.

What is claimed is:

1. A semiconductor light emitting device having a structure in which an active layer is sandwiched between an n-type cladding layer and a p-type semiconductor layer, said active layer, said n-type cladding layer and said p-type semiconductor layer being made of nitride III-V compound semiconductor, said p-type semiconductor layer comprising at least a p-type AlGaN layer, an optical guide layer and a third p-type semiconductor layer, said third p-type semiconductor layer being a p-type cladding layer comprising at least a first and a second p-type semiconductor coating layer whereby the first p-type semiconductor coating layer nearer to said active layer being made of a semiconductor layer material having a larger band gap than that of the second p-type semiconductor coating layer, and the optical guide layer and the second p-type semiconductor coating layer being different in band gap from each other; wherein the optical guide layer has a smaller band gap than the first p-type semiconductor coating layer.

2. The semiconductor light emitting device according to claim 1 wherein the first and the second p-type semiconductor layers are made of $B_xAl_yGa_zIn_{1-x-y-z}N$ (where $0 \leq x \leq 1$, $0 \leq y \leq 1$, $0 \leq z \leq 1$ and $0 \leq x+y+z \leq 1$).

3. The semiconductor light emitting device according to claim 1 wherein said first semiconductor layer forming the portion of said p-type cladding layer near said boundary nearer to the active layer and having the larger band gap is located within the distance of 100 nm from the boundary of said p-type cladding layer nearer to the active layer.

4. The semiconductor light emitting device according to claim 1 wherein said first semiconductor layer forming the portion of said p-type cladding layer near said boundary nearer to the active layer and having the larger band gap has a thickness in the range from 20 nm to 100 nm.

5. The semiconductor light emitting device according to claim 1 wherein said p-type cladding layer is an etched p-type cladding layer.

* * * * *